US007994533B2

(12) United States Patent
Xiao et al.

(10) Patent No.: US 7,994,533 B2
(45) Date of Patent: Aug. 9, 2011

(54) LED LAMP

(75) Inventors: Xu-Hua Xiao, Shenzhen (CN); Yi-San Liu, Shenzhen (CN); Li He, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 308 days.

(21) Appl. No.: 12/238,414

(22) Filed: Sep. 25, 2008

(65) Prior Publication Data

US 2009/0236626 A1 Sep. 24, 2009

(30) Foreign Application Priority Data

Mar. 19, 2008 (CN) .......................... 2008 1 0066129

(51) Int. Cl.
*H01L 33/00* (2010.01)

(52) U.S. Cl. .................... 257/99; 257/98; 257/E33.058; 362/373

(58) Field of Classification Search ........... 257/E33.056, 257/E33.058, E33.075, 98, 99; 164/104.33; 361/687, 709, 688, 710, 825, 826; 362/373
See application file for complete search history.

(56) References Cited

U.S. PATENT DOCUMENTS 5,455,457 A * 10/1995 Kurokawa ..................... 257/712
2002/0131236 A1* 9/2002 Lin ................................ 361/709
2005/0199899 A1* 9/2005 Lin et al. ......................... 257/99
2007/0074857 A1* 4/2007 Xia et al. ................. 165/104.33
2008/0278950 A1* 11/2008 Pickard et al. ................ 362/294

FOREIGN PATENT DOCUMENTS

CN 200946796 Y 9/2007
CN 201003739 Y 1/2008

* cited by examiner

*Primary Examiner* — Matthew Landau
*Assistant Examiner* — Candice Chan
(74) *Attorney, Agent, or Firm* — Frank R. Niranjan

(57) ABSTRACT

An LED lamp includes a first heat sink, a second heat sink thermally contacting the first heat sink, and an LED module mounted on the first heat sink. The first heat sink comprises a plate and a plurality of first fins extending from the plate. The plate has a bare area on a top surface thereof. The LED module is mounted on the bare area and surrounded by the first fins of the first heat sink. The second heat sink comprises a base thermally contacting a bottom surface of the plate of the first heat sink and a plurality of second fins arranged at a bottom surface of the base of the second heat sink. Heat pipes are sandwiched between the plate and base of the first and second heat sinks.

10 Claims, 4 Drawing Sheets

LED LAMP

BACKGROUND OF THE INVENTION

1. Field of the Invention

The present invention relates to an LED lamp, and particularly to an LED lamp having a heat dissipation apparatus for heat dissipation.

2. Description of Related Art

The technology of light emitting diode (LED) has been rapidly developed in recent years from indicators to illumination applications. With the features of long-term reliability, environment friendliness and low power consumption, the LED is viewed as a promising alternative for future lighting products. Nevertheless, the rate of heat generation increases with the illumination intensity. This issue has become a challenge for engineers to design the LED illumination, i.e. the LED lamp.

What is needed, therefore, is an LED lamp which has greater heat-transfer and heat dissipation capabilities, whereby the LED lamp can operate normally for a sufficiently long period of time.

SUMMARY OF THE INVENTION

An LED lamp includes a first heat sink, a second heat sink thermally contacting the first heat sink, and an LED module mounted on the first heat sink. The first heat sink comprises a plate and a plurality of first fins extending from the plate. The plate has a bare area on a top surface thereof. The LED module is mounted on the bare area and surrounded by the first fins of the first heat sink. The second heat sink comprises a base thermally contacting a bottom surface of the plate of the first heat sink and a plurality of second fins arranged at a bottom surface of the base of the second heat sink. Thus, heat generated by the LED module can be dissipated by the first fins of the first heat sink and the second fins of the second heat sink opposite to the first fins to surrounding air. A plurality of heat pipes is sandwiched between the plate of the first heat sink and the base of the second heat sink.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
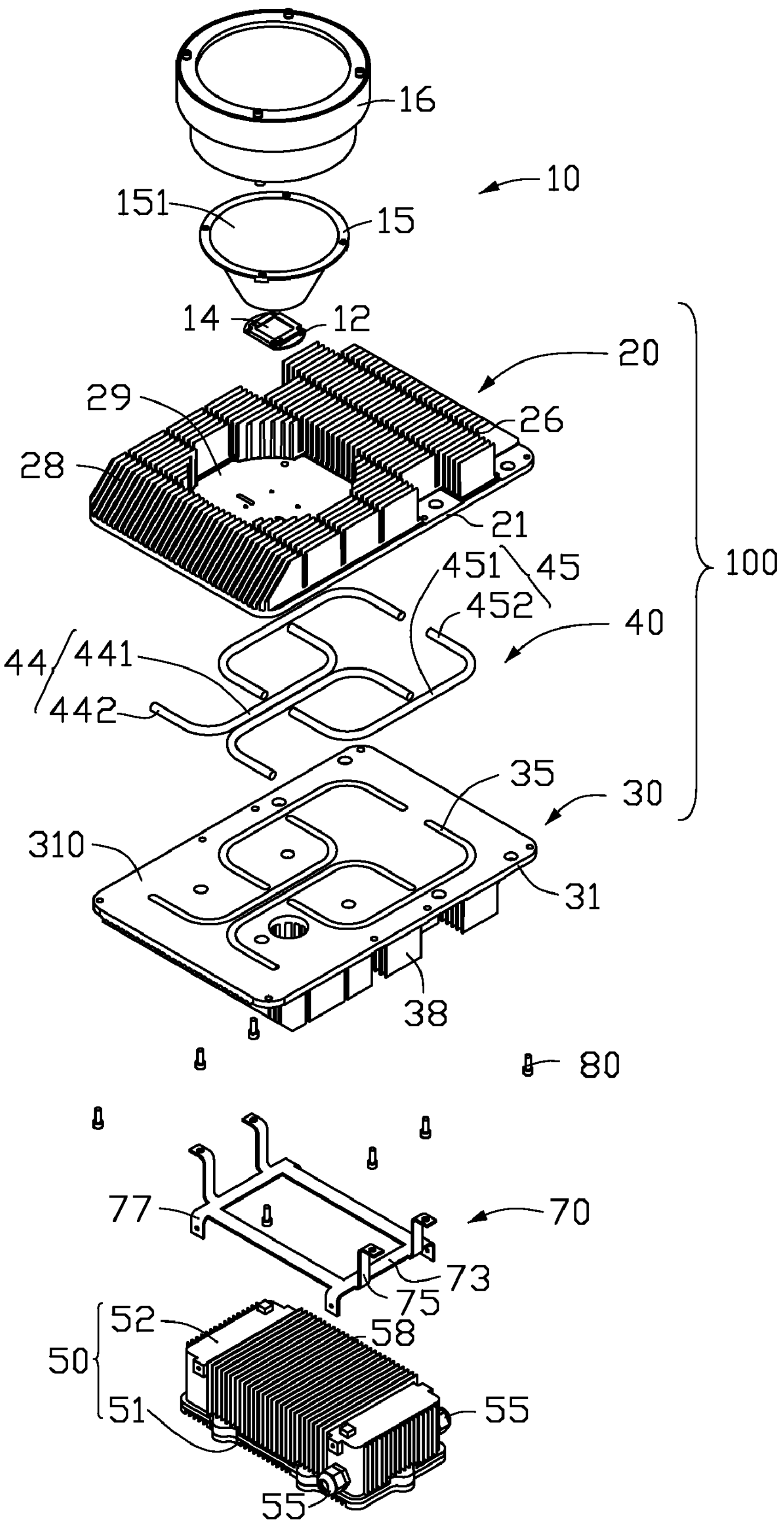
FIG. 1 is an exploded, isometric view of an LED lamp in accordance with a preferred embodiment of the present invention.
Figure 2:
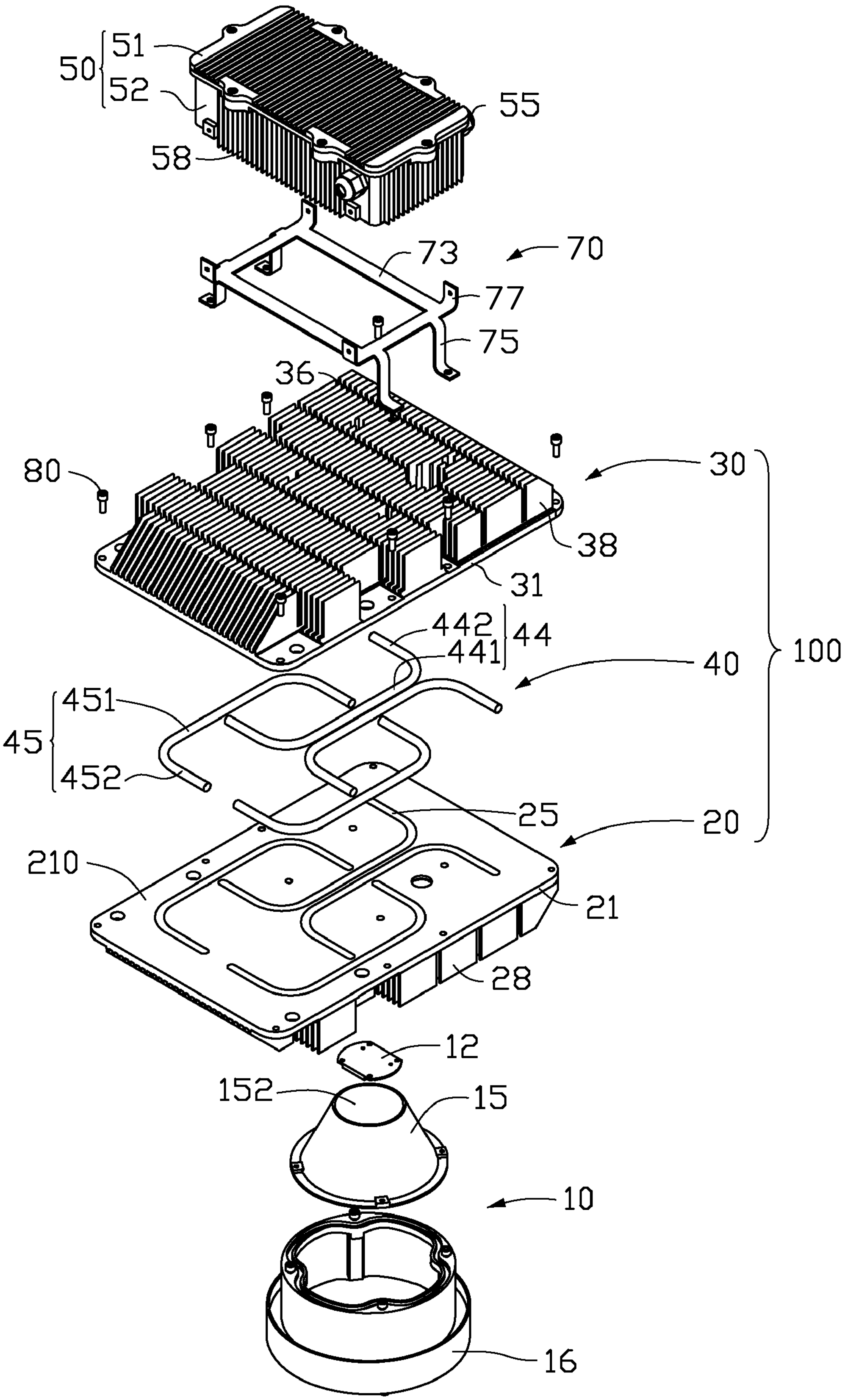
FIG. 2 is an inverted view of FIG. 1.

Referring to FIGS. 1-2, an LED lamp of a preferred embodiment of the invention comprises a heat dissipation apparatus 100, an LED module 10 mounted on a side of the heat dissipation apparatus 100, a junction box 50, and a bracket 70 mounting the junction box 50 on an opposite side of the heat dissipation apparatus 100.

The heat dissipation apparatus 100 comprises a first heat sink 20, a second heat sink 30 engaging with the first heat sink

20, and four heat pipes 40 sandwiched between the first and second heat sinks 20, 30. The four heat pipes 40 includes two pairs of heat pipes, namely a pair of first heat pipes 44 and a pair of second heat pipes 45.

The first heat sink 20 is integrally formed of a metal with a good heat conductivity such as aluminum, copper or alloy thereof. The first heat sink 20 comprises a rectangular plate 21 and a plurality of first fins 28 arranged on the plate 21. The first fins 28 are parallel to each other and extend perpendicularly from a top surface of the plate 21. A plurality of spaced channels 26 is defined in and perpendicular to the first fins 28 for facilitating airflow taking heat away from the first fins 28 into ambient air. The channels 26 cut the first fins 28 into a plurality of similar sections. A portion of the first fins 28 on a substantially middle of the top surface of the plate 21 is milled away to define a bare area 29 therein. The LED module 10 is mounted on the bare area 29 of the plate 21 and surrounded by the first fins 28. In this embodiment, the first fins 28 take a larger surface area of the plate 21 than the bare area 29 does for dissipating heat generated by the LED module 10. A plurality of grooves 25 is defined in a bottom surface 210 of the plate 21 for receiving the heat pipes 40 therein.

The second heat sink 30 has a similar configuration as the first heat sink 20, except the bare area 29. The second heat sink 30 comprises a base 31 and a plurality of second fins 38 extending perpendicularly from a bottom surface of the base 31. The base 31 has a top surface 310 contacting the bottom surface 210 of the plate 21 of the first heat sink 20. A plurality of grooves 35 is defined at the top surface 310 corresponding to the grooves 25 for cooperatively receiving the heat pipes 40. The second fins 38 cover the whole bottom surface of the base 31 and define a plurality of spaced channels 36 therein for facilitating airflow taking heat away from the second fins 38 into ambient air.

Each of the heat pipes 40 has a U-shaped configuration. Each of the first heat pipes 44 comprises a first heat transferring section 441 and two parallel second heat transferring sections 442 extending from two ends of the first heat transferring section 441. The first heat pipes 44 are so oriented that their openings are back to back, and the first heat transferring sections 441 of them closely contact to each other. A central portion of each of the first heat transferring sections 441 is located related to a center of the bare area 29. Each of the second heat pipes 45 comprises a first heat transferring section 451 and two parallel second heat transferring sections 452 extending from two ends of the first heat transferring section 451. The second heat pipes 45 are so oriented that their openings are face to face. Each of the second heat pipes 45 has a second heat transferring section 452 closely contacting to the central portions of the first heat transferring sections 441 of the first heat pipes 44 and located between two second heat transferring sections 442 of each of the first heat pipes 44.

The LED module 10 comprises a printed circuit board 12 installed on the bare area 29 of the plate 21 of the first heat sink 20, a high power LED 14 mounted on the printed circuit board 12, a reflector 15 surrounding the LED 14 and an envelope 16 mounted on the plate 21 for protecting the LED 14. In this embodiment, the reflector 15 has a shape substantially like a funnel with a small opening 152 downwardly toward the LED 14 and a large opening 151 upwardly toward the envelope 16. The envelope 16 has a cylindrical configuration for receiving the printed circuit board 12, the LED 14, and the reflector 15 therein. A light emitted by the LED 14 is reflected by the reflector 15 and transmits through a top of the envelope 16. The LED 14 has a power of 100-300 watts.

The junction box 50 is mounted on the second fins 38 of the second heat sink 30 via the bracket 70 for receiving a driving circuit module (not shown) therein. The junction box 50 is a rectangular box and comprises a house 52 and a cover 51 engaging with a bottom of the house 52. A plurality of third fins 58 extends from outer surface of the house 52 and the cover 51. Two connecting tubes 55 extend through the house 52 respectively for communicating the driving circuit module with an exterior of the house 52, whereby the driving circuit module can connect with an outer power supply. The bracket 70 comprises a rectangular main portion 73, four connection portions 75 extending upwardly from the main portion 73, and four securing portions 77 extending downwardly from ends of the main portion 73. The connection portions 75 are installed on the base 31 of the second heat sink 30 and the securing portions 77 are combined with the house 52 of the junction box 50 to thereby mount the junction box 50 on the second heat sink 30.

Figure 3:
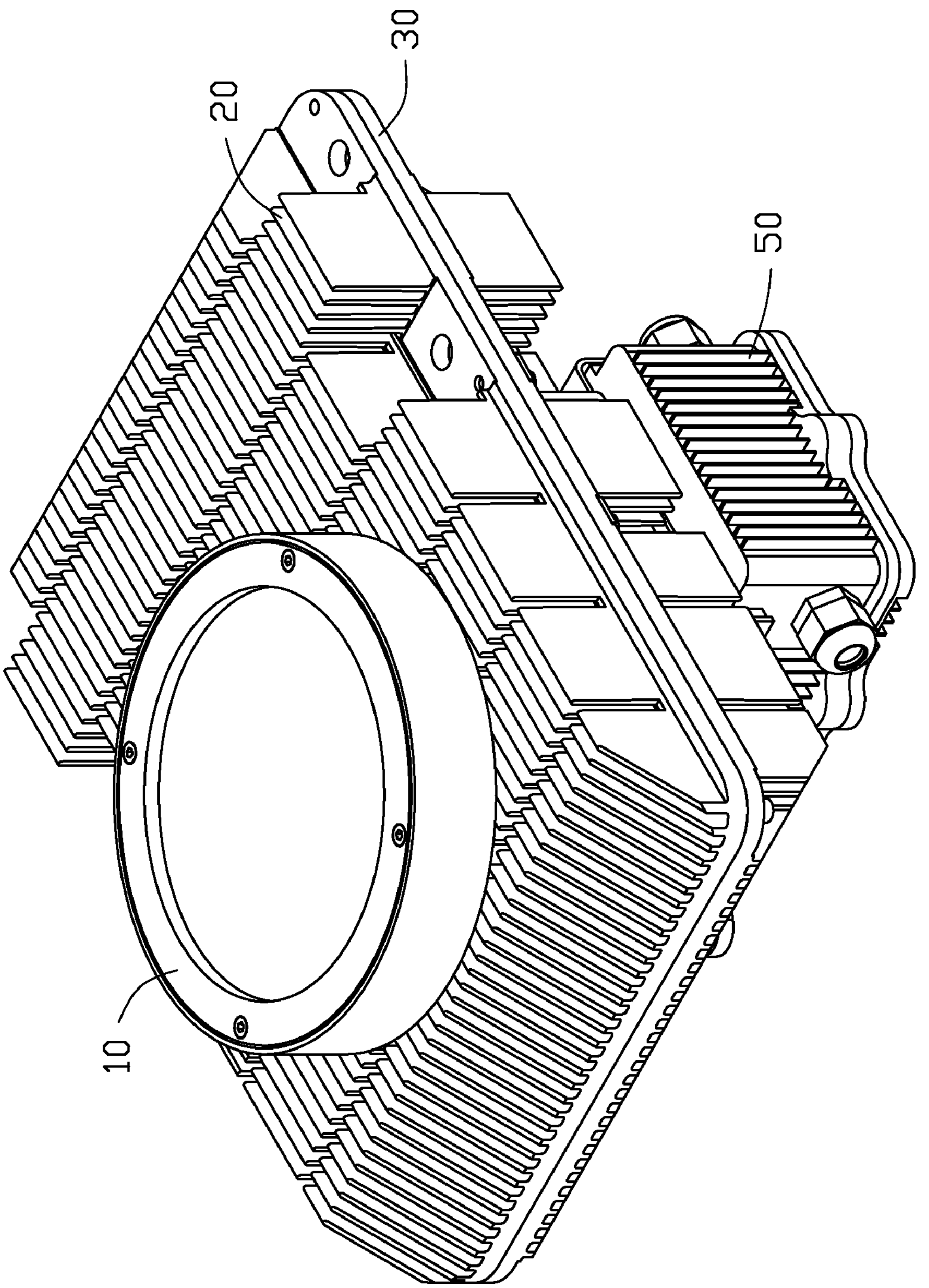
FIG. 3 is an assembled view of the LED lamp in FIG. 1.
Figure 4:
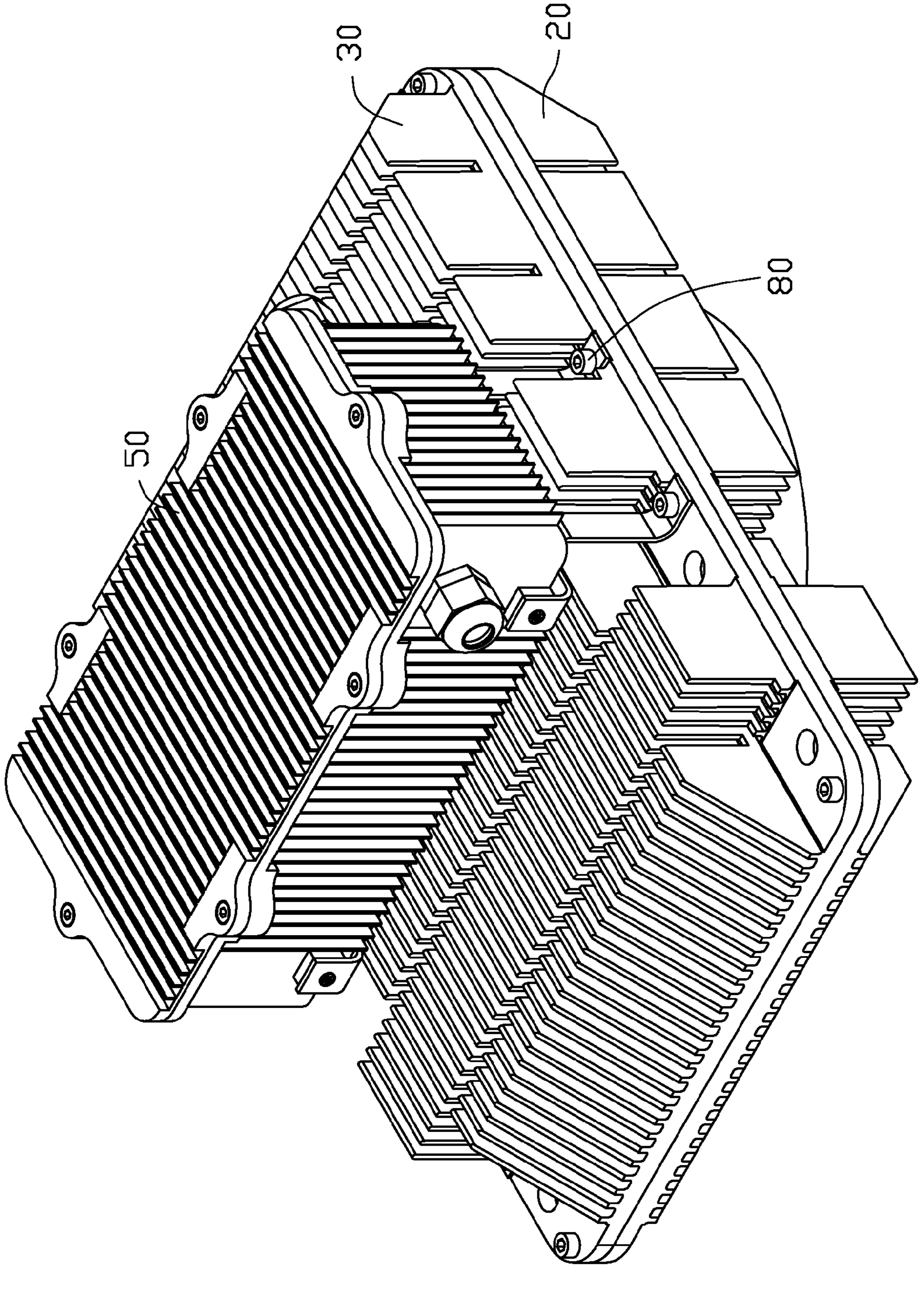
FIG. 4 is an assembled view of the LED lamp in FIG. 2.

Referring also to FIG. 3 and FIG. 4, in assembly of the LED lamp, the LED module 10 having the LED 14 is mounted on the bare area 29 of the plate 21 of the first heat sink 30 and surrounded by the first fins 28. The second fins 38 of the second heat sink 30 are opposite to the first fins 28. The LED module 10 and the first fins 28 are located at the same side of the plate 21 of the first heat sink 20. The first heat sink 30 and the second heat sink 40 are engaged with each other via a plurality of screws 80. The heat pipes 40 are sandwiched between the first and second heat sinks 20, 30 and correspondingly received in the grooves 25 of the plate 21 of the first heat sink 20 and the grooves 35 of the base 31 of the second heat sink 30. Central portions of the first transferring sections 441 of the first heat pipes 44 which are located just below the LED 14 function as evaporation portions of the first heat pipes 44. Other portions of the first heat pipes 44 are used as condensation portions. The second transferring section 452 of each second heat pipe 45 which is located just below the LED 14 functions as an evaporation portion and the other second transferring section 451 which is located far away from the LED 14 functions as a condensation portion of the second heat pipe 45. The second heat pipes 45 cooperatively form a square configuration in which one of the second heat transferring sections 442 of each first heat pipe 44 is extended. The first transferring sections 441 of the first heat pipes 44 are sandwiched between two ends of the second transferring sections 452 of the second heat pipe 45 located just below the LED 14.

In use of the LED lamp, heat generated by the LED 14 is absorbed by the plate 21 of the first heat sink 20 and the base 31 of the second heat sink 30, and then delivered to the first fins 28 and second fins 38 to be dissipated into ambient air. The LED 14 is thus cooled and works within allowable temperature range. Since the heat generated by the LED 14 can be dissipated by the first and second fins 28, 38 at two sides of the LED lamp, the heat dissipating area of the LED lamp is increased. Besides, the heat pipes 40 transfer the heat from a part of the plate 21 corresponding to the location of the LED 14 to other parts of the plate 21 so that the heat is quickly and evenly spread to the whole first and second heat sink 20, 30.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp comprising:

a first heat sink comprising a plate and a plurality of first fins extending from the plate, the plate having a bare area on a top surface thereof and the first fins surrounding the bare area;

an LED module being mounted on the bare area of the plate of the first heat sink and surrounded by the first fins; and a second heat sink having a base thermally contacting a bottom surface of the plate of the first heat sink and a plurality of second fins arranged at a bottom surface of the base of the second heat sink;

wherein a junction box is mounted on the second fins of the second heat sink via a bracket, the bracket comprising a rectangular main portion, four connection portions extending from the main portion and being installed on the second heat sink, and four securing portions extending downwardly from ends of the main portion to connect the junction box, the junction box extending a plurality of third fins from an outer surface thereof.

2. The LED lamp as claimed in claim 1, further comprising a plurality of heat pipes sandwiched between the plate of the first heat sink and the base of the second heat sink.

3. The LED lamp as claimed in claim 2, wherein the heat pipes comprise a pair of first heat pipes and a pair of second heat pipes, each of the heat pipes having a U-shaped configuration.

4. The LED lamp as claimed in claim 3, wherein the first heat pipes are so oriented that their openings are back to back, each of the first heat pipes comprising a first heat transferring section being located just below the LED module and two second heat transferring sections extending from two ends of the first heat transferring section.

5. The LED lamp as claimed in claim 4, wherein the second heat pipes are so oriented that their openings are face to face, each of the second heat pipes comprising a first heat transferring section and two second heat transferring sections extending from two ends of the first heat transferring section, one second heat transferring section for each second heat pipe being located just below the LED module.

6. The LED lamp as claimed in claim 5, wherein the one second heat transferring section of each of the second heat pipes which is located just below the LED module is located between two second heat transferring sections of each of the first heat pipes.

7. The LED lamp as claimed in claim 1, wherein a plurality of spaced channels is defined in and perpendicular to the first fins of the first heat sink and cuts the first fins into a plurality of similar sections.

8. The LED lamp as claimed in claim 1, wherein the first fins take a larger surface area of the plate of the first heat sink than the bare area does.

9. An LED lamp comprising:

a first heat sink comprising a plate and a plurality of first fins extending from the plate;

a second heat sink comprising a base and a plurality of second fins extending from the base, the base thermally contacting the plate of the first heat sink;

an LED module being mounted on the plate of the first heat sink and surrounded by the first fins; and a plurality of heat pipes sandwiched by the plate of the first heat sink and the base of the second heat sink, parts of the heat pipes being located just below the LED module and other parts extending away from the LED module;

wherein the heat pipes comprises a pair of first heat pipes and a pair of second heat pipes, each of the first and second heat pipes having a U-shaped configuration, the first heat pipes being so oriented that their openings are back to back, the second heat pipes being so oriented that their openings are face to face;

wherein each of the first heat pipes comprises a first heat transferring section and two second heat transferring sections extending from two ends of the first heat transferring section, and each of the second heat pipes comprises a first heat transferring section and two second heat transferring sections extending from two ends of the first heat transferring section of each of the second heat pipes;

wherein middle portions of the first heat transferring sections of the first heat pipes are located just below the LED module, one second heat transferring section of each of the second heat pipes being located near the middle portions of the first heat transferring sections of the first heat pipes and just below the LED module, and being located between the two second heat transferring sections of each of the first heat pipes; and wherein a junction box is mounted on the second fins of the second heat sink via a bracket, the bracket comprising a rectangular main portion, four connection portions extending from the main portion and being installed on the second heat sink, and four securing portions extending downwardly from ends of the main portion to connect the junction box, the junction box extending a plurality of third fins from an outer surface thereof.

10. The LED lamp as claimed in claim 9, wherein the plate of the first heat sink and the base of the second heat sink define grooves to receive the heat pipes therein.

* * * * *